(12) United States Patent
Hou

(10) Patent No.: US 11,539,020 B2
(45) Date of Patent: Dec. 27, 2022

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventor: Wenjun Hou, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 220 days.

(21) Appl. No.: 16/910,092

(22) Filed: Jun. 24, 2020

(65) Prior Publication Data
US 2021/0066646 A1   Mar. 4, 2021

(30) Foreign Application Priority Data

Aug. 30, 2019   (CN) .......................... 201910816481.6

(51) Int. Cl.
| H01L 27/32 | (2006.01) |
| H01L 51/00 | (2006.01) |
| H01L 51/52 | (2006.01) |
| H01L 51/56 | (2006.01) |

(52) U.S. Cl.
CPC ...... *H01L 51/5237* (2013.01); *H01L 27/3246* (2013.01); *H01L 51/56* (2013.01); *H01L 2227/323* (2013.01)

(58) Field of Classification Search
CPC ........ H05K 2203/1173; H05K 2203/13; H01L 51/0004–0005
See application file for complete search history.

(56) References Cited

U.S. PATENT DOCUMENTS

| 2008/0226902 A1 | 9/2008 | Giannantonio et al. |
| 2015/0380683 A1 | 12/2015 | You |
| 2021/0359258 A1* | 11/2021 | Guo .................... H01L 27/3246 |

FOREIGN PATENT DOCUMENTS

| CN | 101262942 A | 9/2008 |
| CN | 103490019 A | 1/2014 |
| CN | 109920933 A | 6/2019 |

OTHER PUBLICATIONS

Office Action dated Apr. 26, 2021 for Chinese Patent Application No. 201910816481.6 and English Translation.

* cited by examiner

*Primary Examiner* — Fernando L Toledo
*Assistant Examiner* — Valerie N Newton
(74) *Attorney, Agent, or Firm* — Ling Wu; Stephen Yang; Ling and Yang Intellectual Property

(57) ABSTRACT

Provided is a display substrate, a preparation method thereof and a display apparatus. The display substrate includes a base substrate, which has a display area and an encapsulation area, the encapsulation area surrounds the display area, and a hydrophobic structure is arranged on the encapsulation area.

18 Claims, 2 Drawing Sheets

DISPLAY SUBSTRATE AND PREPARATION METHOD THEREOF, AND DISPLAY APPARATUS

CROSS REFERENCE TO RELATED APPLICATION

This application claims the priority of Chinese Patent Application No. 201910816481.6 filed to the CNIPA on Aug. 30, 2019, the entire content of which is hereby incorporated by reference.

TECHNICAL FIELD

The present disclosure relates to, but is not limited to, the technical field of display, in particular to a display substrate and a preparation method thereof, and a display apparatus.

BACKGROUND

An Organic Light-Emitting Diode (OLED) display apparatus is considered to be the most promising display device in the field of display due to its advantages of self-luminescence, fast response, wide viewing angle, high brightness, brilliant color and lightness, etc.

The OLED display apparatus relies on an OLED display panel to display, the OLED display panel includes an OLED display substrate and an encapsulation substrate which are oppositely arranged, and the OLED display substrate and the encapsulation substrate are fixed through encapsulation adhesive arranged between the OLED display substrate and the encapsulation substrate. The OLED display substrate includes a base substrate and an Organic Light-Emitting device (OLED) arranged on the base substrate, wherein the base substrate has a display area and an encapsulation area, the encapsulation area surrounds the display area and is adjacent to the display area, the organic Light-Emitting device (OLED) is positioned in the display area, and the encapsulation adhesive is arranged in the encapsulation area.

At present, there are mainly two deposition methods for organic Light-Emitting device (OLED) thin films, vacuum evaporation and solution process. First, the vacuum evaporation is suitable for organic small molecules, with good film formation uniformity and relatively mature technology, but requires large equipment investment and has low material utilization rate and low mask alignment precision for large-size products. Second, the solution process, which includes spin coating, ink jet printing, nozzle coating, etc., is suitable for polymer materials and soluble small molecules. It has low equipment cost and outstanding advantages in large-scale and large-size production.

A special-shaped OLED display panel is a relatively unique display panel with special appearance of display. Its display area is a special-shaped area (referring to non-rectangular area, such as a circular area). The special-shaped area provides flexibility and diversity of the display. The special-shaped area is not only a carrier for the display, but also utilized to attract attentions of customers.

However, for the special-shaped OLED display panel, an ink-jet printing area overlaps with an encapsulation area. During the ink-jet printing process, the encapsulation area will be printed with ink, which affects the adhesiveness of the encapsulation adhesive and encapsulation reliability, so an encapsulation effect of the OLED display substrate is poor.

SUMMARY

The following is a summary of the subject matter described in detail herein. This summary is not intended to limit the protection scope of the claims.

A display substrate includes a base substrate, the base substrate having a display area and an encapsulation area, the encapsulation surrounding the display area, and a hydrophobic structure being arranged on the encapsulation area.

In an exemplary embodiment, the base substrate further has an ink deposition area surrounding the encapsulation area.

In an exemplary embodiment, a periphery of the ink deposition area has a hydrophobic defining area.

In an exemplary embodiment, the hydrophobic structure includes a plurality of hydrophobic columns arranged in an array in the encapsulation area, and gaps are provided between the hydrophobic columns.

In an exemplary embodiment, a height h of the hydrophobic column and a distance d between two adjacent hydrophobic columns satisfy a relation: $h/d>0.5$, wherein $0.5 \text{ microns} \leq h \leq 5 \text{ microns}$.

In an exemplary embodiment, the hydrophobic column is a cylinder or a prism.

In an exemplary embodiment, heights of the hydrophobic columns are identical.

In an exemplary embodiment, material of the hydrophobic structure is a hydrophobic organic material.

In an exemplary embodiment, the material of the hydrophobic structure adopts at least one of polymethyl methacrylate, fluorinated polymethyl methacrylate, polyimide and fluorinated polyimide.

In an exemplary embodiment, an outer surface of the hydrophobic structure is a rough surface.

In an exemplary embodiment, the outer surface of the hydrophobic structure is provided with a plurality of holes with a diameter of 300 nm to 800 nm to form the rough surface.

In an exemplary embodiment, the base substrate further has an edge area, the encapsulation area is located between the display area and the edge area, and a first barricade structure is provided above the edge area.

In an exemplary embodiment, the material of the first barricade structure is a hydrophobic material.

In an exemplary embodiment, a second barricade structure is provided above the display area, and both the first barricade structure and the second barricade structure are barricade structures in a pixel defining layer of the display substrate.

In an exemplary embodiment, peripheral lines are arranged in the edge area.

In an exemplary embodiment, a width of the encapsulation area is 1 mm-3 mm.

The present disclosure also provides a display device including the display substrate of any one of the foregoing.

A preparation method for a display substrate panel includes: providing a base substrate, the base substrate having a display area and an encapsulation area, the encapsulation area surrounding the display area; and forming a hydrophobic structure on the encapsulation area.

In an exemplary embodiment, after forming the hydrophobic structure on the encapsulation area, the preparation method for the display substrate further includes: forming a pixel defining layer on the base substrate on which the hydrophobic structure has been formed; forming a light emitting functional layer on the display area through an ink jet printing process; forming a passivation layer on the light emitting functional layer; forming an encapsulation adhesive layer on the encapsulation area; and forming an encapsulation layer on the encapsulation adhesive layer.

In an exemplary embodiment, forming the hydrophobic structure on the encapsulation area includes: forming a pixel defining layer on the base substrate, the pixel defining layer including a third barricade structure located in the encapsulation area; and dry etching the third barricade structure to roughen a surface of the third barricade structure to form the hydrophobic structure.

Other aspects will become apparent upon reading and understanding the drawings and detailed description.

BRIEF DESCRIPTION OF DRAWINGS

Accompanying drawings are used to provide a further understanding of technical solutions of the present disclosure, form a part of the specification, and explain technical solutions of the present disclosure together with embodiments of the present disclosure, while they do not constitute a limitation on the technical solutions of the present disclosure. Shapes and sizes of the components in the drawings do not reflect true proportions, and are only for the purpose of schematically illustrating the present disclosure.

DETAILED DESCRIPTION

Embodiments herein may be implemented in a number of different forms. Those of ordinary skill in the art may easily understand the fact that the implementation mode and content can be changed into various forms without departing from the purpose and scope of the present disclosure. Therefore, the present disclosure should not be construed as limited only to what is described in the following embodiments. Without conflict, embodiments in the present disclosure and features in the embodiments may be combined with each other arbitrarily.

The present disclosure provides a display substrate, a preparation method thereof and a display apparatus. The display substrate of the present disclosure includes a base substrate, wherein the base substrate has a display area and an encapsulation area, the encapsulation area surrounds the display area, and a hydrophobic structure is arranged on the encapsulation area. The present disclosure utilizes the hydrophobic structure on the encapsulation area to separate ink printed to the encapsulation area so as to prevent the ink from depositing in the encapsulation area, thereby avoiding an influence of the ink on the adhesiveness of the encapsulation adhesive and further improving an encapsulation effect of the display substrate.

Figure 1:
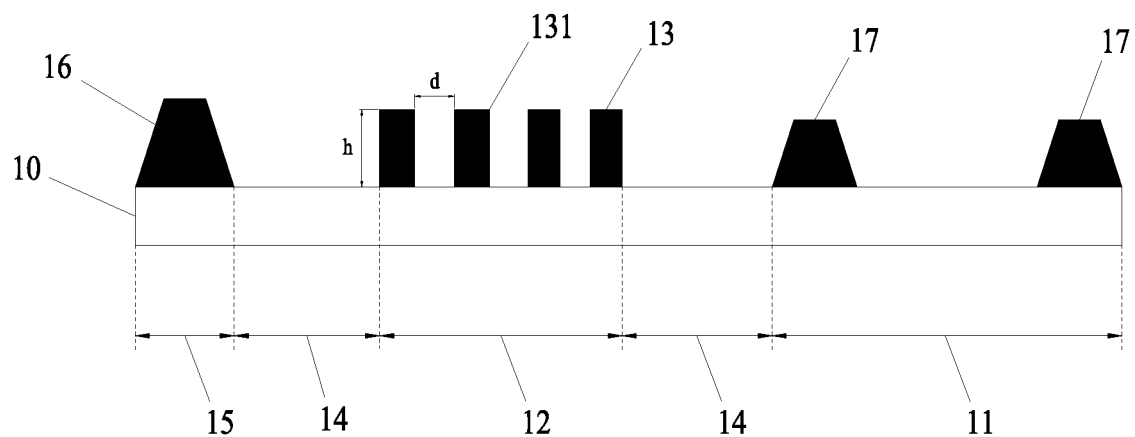
FIG. 1 is a schematic structural diagram of a display substrate according to the present disclosure.

FIG. 1 is a schematic structural diagram of a display substrate of the present disclosure. As shown in FIG. 1, the display substrate of the present disclosure includes a base substrate 10 having a display area 11 and an encapsulation area 12, the encapsulation area 12 surrounds the display area 11, and a hydrophobic structure 13 is arranged on the encapsulation area 12. A width of the encapsulation area 12 is 1 mm to 3 mm.

As shown in FIG. 1, in the display substrate of the present disclosure, a light-emitting functional layer (e.g., an organic light-emitting layer, a hole injection layer, a hole transmission layer, etc.) may be prepared in the display area 11 through an ink jet printing process. In the process of preparing the light-emitting functional layer, the encapsulation area 12 will be printed with ink, which affects an adhesiveness of the encapsulation adhesive and the adhesiveness of the encapsulation adhesive with the base substrate 10. In the present disclosure, the hydrophobic structure 13 may separate ink printed on the encapsulation area 12 from the encapsulation area 12 to prevent the ink from depositing on the encapsulating area 12, thereby avoiding an influence of the ink on the adhesiveness of the encapsulation adhesive and further improving an encapsulation effect of the display substrate.

In the embodiment of the present disclosure, since the encapsulating area of the display substrate is provided with a hydrophobic structure, ink is not easy to deposit in the encapsulation area when the light emitting functional layer in the display area is prepared through the ink jet printing process. The solution provided by the embodiment of the present disclosure may avoid the influence of ink on the adhesiveness of the encapsulation adhesive and improve the encapsulation effect of the display substrate.

As shown in FIG. 1, the base substrate 10 further has an ink deposition area 14 surrounding the encapsulation area 12. The ink deposition area 14 is configured for storing ink transferred from the encapsulation area 12 due to the hydrophobic structure 13. For example, when the hydrophobic structure 13 separates the ink printed to the encapsulation area 12 from the encapsulation area 12, the ink will be transferred to the periphery of the encapsulation area 12 until it is located on the ink deposition area 14.

In an exemplary embodiment, the periphery of the ink deposition area 14 has a hydrophobic defining area surrounding the ink deposition area 14 for defining a flow of ink in the ink deposition area 14 and preventing the ink from flowing into the encapsulation area 12 over the ink deposition area 14.

As shown in FIG. 1, the hydrophobic structure 13 includes a plurality of hydrophobic columns 131 arranged in an array in the encapsulation area 12, and gaps are provided between the plurality of hydrophobic columns 131. The structure of the plurality of hydrophobic columns 131 may be same, and the structure of each hydrophobic column 131 may be a cylinder or a prism, and the prism may be any polygonal prism such as a triangular prism, a quadrangular prism, or an octagonal prism, which are not limited in the present disclosure.

As shown in FIG. 1, heights of the plurality of hydrophobic columns 131 are identical, and the plurality of hydrophobic columns 131 are uniformly distributed in the encapsulation area 12.

As shown in FIG. 1, a height h of any hydrophobic column 131 and a distance d between two adjacent hydrophobic columns 131 satisfy a relation: $h/d>0.5$, $0.5$ microns$\leq h \leq 5$ microns. The height h of the hydrophobic column 131 and the distance d between adjacent two hydrophobic columns 131 satisfy the above-mentioned relational expression, which may ensure that the distance d between two hydrophobic columns 131 is smaller than the size of an ink drop, thereby preventing the ink from entering into the gap between two hydrophobic columns 131, so that the ink is separated from the remote side of the hydrophobic structure 13 from the base substrate 10, and a good hydrophobic effect of the hydrophobic structure 13 is ensured.

In an exemplary embodiment, the height h of any hydrophobic column 131 is 1.5 microns, and the distance d between two adjacent hydrophobic columns 131 is 1.5 microns. The height of the hydrophobic column 131 refers to the length of the hydrophobic column 131 in a direction perpendicular to the surface of the base substrate 10, and the distance between two adjacent hydrophobic columns 131 refers to a minimum distance between the two adjacent hydrophobic columns 131.

In the present disclosure, a hydrophobic organic material is used as the material of the hydrophobic structure. For example, the material of the hydrophobic structure adopts at least one of polymethyl methacrylate, fluorinated polymethyl methacrylate, polyimide and fluorinated polyimide to ensure the hydrophobic effect of the hydrophobic structure.

In the present disclosure, an outer surface of the hydrophobic structure is a rough surface to improve the hydrophobicity of the hydrophobic structure so as to ensure the hydrophobic effect of the hydrophobic structure. The outer surface of the hydrophobic structure may be uneven to form a rough surface, or the outer surface of the hydrophobic structure may be provided with holes to form a rough surface. For example, the outer surface of the hydrophobic structure is provided with a plurality of holes with a diameter of 300 nm to 800 nm to form a rough surface. The present disclosure does not limit the structure of the rough surface.

As shown in FIG. 1, the base substrate 10 further has an edge area 15, the encapsulation area 12 and the ink deposition area 14 are located between the display area 11 and the edge area 15. A first barricade structure 16 is disposed on the edge area 15, a second barricade structure 17 is disposed on the display area 11, and the materials of the first barricade structure 16 and the second barricade structure 17 are both hydrophobic materials.

As shown in FIG. 1, the display substrate of the embodiment generally includes a pixel defining layer (not shown in FIG. 1), and both the first barricade structure 16 and the second barricade structure 17 may be barricade structures in the pixel defining layer. It should be noted that peripheral lines are usually arranged in the edge area 15, and the first barricade structure 16 is configured for blocking ink separated from the encapsulation area 12 to prevent ink from flowing to the edge area 15 to affect the peripheral lines. The second barricade structure 17 is configured for defining a pixel area in the display area 11.

The hydrophobic process of the hydrophobic structure will be described below.

As shown in FIG. 1, in a process of preparing the light-emitting functional layer by an ink jet printing process, ink is printed on the remote side of the hydrophobic structure 13 from the base substrate 10, ink drops roll on the remote side of the hydrophobic structure 13 from the base substrate 10, and finally roll down to the ink deposition area 14, and are deposited in the ink deposition area 14, and no ink is deposited in the encapsulation area 12.

When the display substrate is encapsulated, an encapsulation adhesive layer may be printed or coated on the remote side of the hydrophobic structure 13 from the base substrate 10. Compared with the ink, the adhesiveness of the encapsulation adhesive layer is higher, so the encapsulation adhesive layer does not flow on the hydrophobic structure 13 but adheres to the remote side of the hydrophobic structure 13 from the base substrate 10.

It should be noted that the display substrate provided by the present disclosure may be an electro light emitting display substrate, for example, an OLED display substrate or Quantum Dot Light Emitting Diodes (QLED) display substrate. The display substrate may also include other structures such as a Thin Film Transistor and a light emitting unit. The Thin Film Transistor (TFT) may be a low temperature polysilicon TFT, an amorphous silicon TFT or an oxide TFT. The light emitting unit may be an OLED light emitting unit or a QLED light emitting unit. The light emitting unit generally includes an anode, a light emitting layer, and a cathode. In addition, the OLED light emitting unit may also include a hole injection layer, a hole transmission layer, an electron transmission layer, and an electron injection layer, etc. The hole injection layer, the hole transmission layer, the light emitting layer, the electron transmission layer, and the electron injection layer may all be referred to as the light emitting functional layer mentioned in the present disclosure, wherein related technologies may be referred to for structures not shown in the display substrate, which will not be described here.

In conclusion, since the encapsulation area is provided with the hydrophobic structure in the display substrate provided by the present disclosure, ink is not easy to deposit in the encapsulation area when the light emitting functional layer is prepared in the display area through the ink jet printing process. The solution provided by the present disclosure may avoid an influence of ink on the adhesiveness of the encapsulation adhesive and improve the encapsulation effect of the display substrate.

The present disclosure further provides a method for preparing a display substrate to prepare the display substrate of the previous embodiment.

Figure 2:
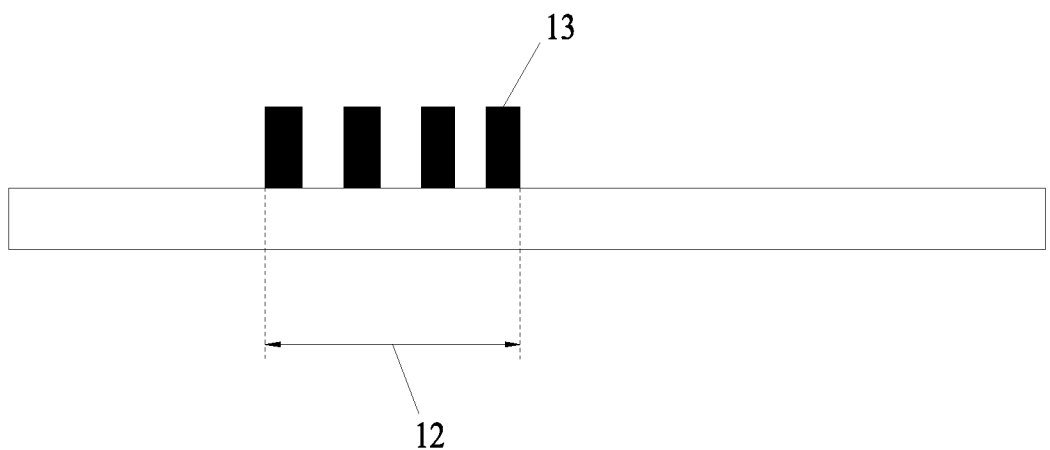
FIG. 2 is a cross-sectional view of a base substrate after a hydrophobic structure is formed thereon according to the present disclosure.
Figure 3:
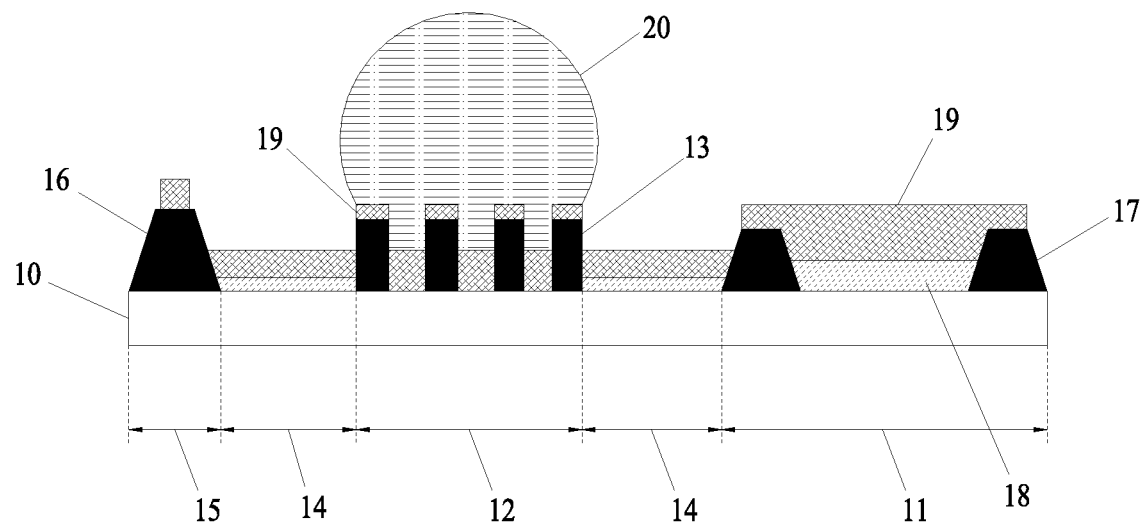
FIG. 3 is a schematic structural diagram of a display substrate after an encapsulation adhesive layer is formed according to the present disclosure.

FIG. 2 is a cross-sectional view of a base substrate after a hydrophobic structure is formed thereon according to the present disclosure. FIG. 3 is a schematic structural diagram of a display substrate after an encapsulation adhesive layer is formed according to the present disclosure. As shown in FIGS. 2 and 3, in an exemplary embodiment, the method for preparing a display substrate includes the following acts.

1) A base substrate 10 is provided, which having a display area 11, an encapsulation area 12, an ink deposition area 14, and an edge area 15, wherein the encapsulation area 12 surrounds the display area 11, the ink deposition area 14 surrounds the encapsulation area 12, and the encapsulation area 12 and the ink deposition area 14 are located between the display area 11 and the edge area 15.

2) A hydrophobic structure 13 is formed on the encapsulation area 12 of the base substrate 10 by a patterning process.

3) A pixel defining layer is formed by a patterning process on the base substrate 10 on which the hydrophobic structure 13 has been formed. The pixel defining layer includes a first barricade structure 16 located in the edge area 15 and a second barricade structure 17 located in the display area 11.

4) A light emitting functional layer 18 is formed on the display area 11 by an ink jet printing process.

5) A passivation layer 19 is formed on the encapsulation area 12 by a patterning process. Alternatively, a passivation layer 19 is formed on the display area 11, the encapsulation area 12, the ink deposition area 14, and the edge area 15. A thickness of the passivation layer 19 may be 1 micron to 3 microns.

6) An encapsulation adhesive layer 20 is formed on the hydrophobic structure 13 of the encapsulation area 12.

7) An encapsulation layer 20 is formed on the encapsulation adhesive layer 20.

The "patterning process" mentioned in the present disclosure includes deposition of a film layer, coating of photoresist, mask exposure, development, etching, stripping of photoresist, etc., and is a mature preparation process in related technologies. The deposition may adopt known processes such as sputtering, evaporation, chemical vapor deposition, etc., the coating may adopt known coating processes, and the etching may adopt known methods, which are not limited here. In the description of the present disclosure, "thin film" refers to a layer of thin film made of a certain material by deposition or other processes on a substrate. If the "thin film" does not need a patterning process during the whole manufacturing process, the "thin film" can also be called a "layer". If the "thin film" needs a patterning process during the whole manufacturing process, it is called "thin film" before the patterning process and "layer" after the patterning process. The "layer" after the patterning process contains at least one "pattern".

Figure 4:
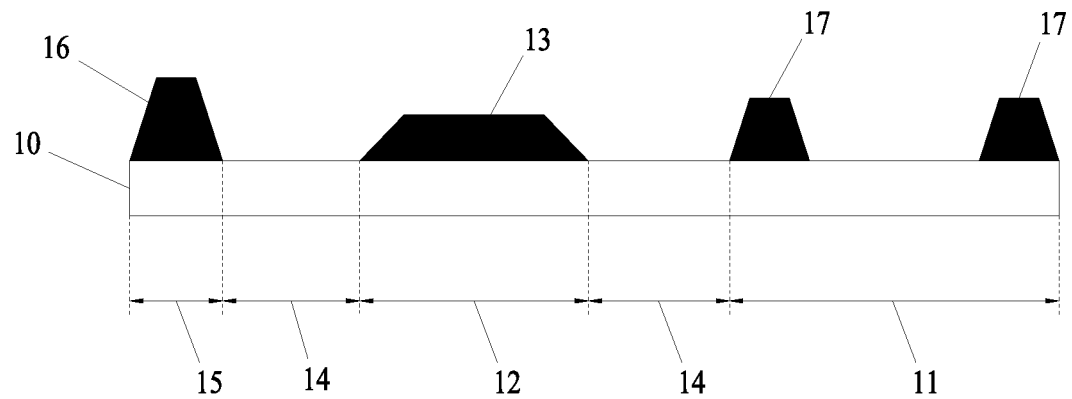
FIG. 4 is a schematic structural diagram of a display substrate according to the present disclosure.

FIG. 4 is a schematic structural diagram of a display substrate disclosed herein. As shown in FIG. 4, the structure of the display substrate of the present disclosure is similar to that described in any of the previous embodiments, but the pixel defining layer in the display substrate of the present disclosure includes a first barricade structure 16 located in the edge area 15, a second barricade structure 17 located in the display area 11, and a third barricade structure located in the encapsulation area 12, and the third barricade structure covers the encapsulation area 12. Then, blocking is performed by a mask process, and the third barricade structure above the encapsulation area 12 is dry etched, so that the surface of the third barricade structure is roughened and has hydrophobic property to form the hydrophobic structure 13.

The solution provided by the embodiment may avoid an influence of ink on the adhesiveness of the encapsulation adhesive and improve an encapsulation effect of the display substrate.

The present disclosure also provides a display apparatus including any one of the aforementioned display substrates. The display apparatus may be any product or component with a display function such as a mobile phone, a tablet computer, a television, a display, a notebook computer, a digital photo frame, a navigator, etc.

In the description of the present application, it should be understood that, azimuth or positional relationships indicated by terms "upper", "lower", "front", "rear", "top", "bottom" and the like is based on the azimuth or positional relationship shown in the drawings, which is only for ease of description of the present disclosure and simplification of the description, rather than indicating or implying that the apparatus or element referred to must have a specific orientation, or must be constructed and operated in a particular orientation, and therefore cannot be construed as limiting the present disclosure.

In the description of the present disclosure, it should be noted that the terms "install", "connect" and "connection" should be understood broadly unless otherwise specified and defined, for example, it may be a fixed connection, a detachable connection, or an integrated connection; may be a mechanical connection or may be an electrical connection; may be directly connected, or may be indirectly connected through an intermediate medium, or may be an internal connection between two elements. Those of ordinary skilled in the art can understand the specific meanings of the above terms in the present disclosure according to specific situations.

Although implementations disclosed in the present disclosure are as the above, the contents are only implementations for facilitating understanding the present disclosure and are not used to limit the present disclosure. Any person skilled in the field to which the present disclosure pertains can make any modifications and variations in the forms and details of implementation without departing from the spirit and the scope disclosed in the present disclosure, but the patent protection scope of the present disclosure should still be subject to the scope defined by the appended claims.

What we claim is:

1. A display substrate, comprising a base substrate, the base substrate having a display area and an encapsulation area, the encapsulation area surrounding the display area, and a hydrophobic structure being arranged on the encapsulation area,
   wherein the hydrophobic structure comprises a plurality of hydrophobic columns arrayed in the encapsulation area, and gaps are arranged between the hydrophobic columns;
   wherein height h of the hydrophobic columns and distance d between two adjacent hydrophobic columns satisfy: $h/d>0.5$, wherein 0.5 microns$<h<$5 microns; and
   wherein the distance d between two adjacent hydrophobic columns is smaller than a size of an ink drop, and the ink drop is separated from a side of the hydrophobic structure away from the base substrate.

2. The display substrate according to claim 1, wherein the base substrate further has an ink deposition area surrounding the encapsulation area.

3. The display substrate according to claim 2, further comprising a hydrophobic defining area surrounding the ink deposition area.

4. The display substrate according to claim 1, wherein the hydrophobic column is a cylinder or a prism.

5. The display substrate according to claim 1, wherein heights of the hydrophobic columns are identical.

6. The display substrate according to claim 1, wherein a material of the hydrophobic structure is a hydrophobic organic material.

7. The display substrate according to claim 6, wherein the material of the hydrophobic structure adopts at least one of polymethyl methacrylate, fluorinated polymethyl methacrylate, polyimide and fluorinated polyimide.

8. The display substrate according to claim 1, wherein an outer surface of the hydrophobic structure is a rough surface.

9. The display substrate according to claim 8, wherein the outer surface of the hydrophobic structure is provided with a plurality of holes with a diameter of 300 nm to 800 nm to form the rough surface.

10. The display substrate according to claim 1, wherein the base substrate further has an edge area, the encapsulation area is located between the display area and the edge area, and a first barricade structure is arranged on the edge area.

11. The display substrate of claim 10, wherein a material of the first barricade structure is a hydrophobic material.

12. The display substrate according to claim 10, wherein a second barricade structure is arranged on the display area, and the first barricade structure and the second barricade structure are both barricade structures in a pixel defining layer of the display substrate.

13. The display substrate according to claim 10, wherein peripheral lines are arranged in the edge area.

14. The display substrate according to claim 1, wherein a width of the encapsulation area is 1 mm to 3 mm.

15. A display apparatus, comprising the display substrate according to claim 1.

16. A method for preparing a display substrate, comprising:
- providing a base substrate, wherein the base substrate has a display area and an encapsulation area, and the encapsulation area surrounds the display area; and
- forming a hydrophobic structure on the encapsulation area,
- wherein the hydrophobic structure comprises a plurality of hydrophobic columns arrayed in the encapsulation area, and gaps are arranged between the hydrophobic columns;
- wherein height h of the hydrophobic columns and distance d between two adjacent hydrophobic columns satisfy: h/d>0.5, wherein 0.5 microns<h<5 microns; and
- wherein the distance d between two adjacent hydrophobic columns is smaller than a size of an ink drop, and the ink drop is separated from a side of the hydrophobic structure away from the base substrate.

17. The method for preparing the display substrate according to claim 16, wherein after forming the hydrophobic structure on the encapsulation area, the method further comprises:
- forming a pixel defining layer on the base substrate on which the hydrophobic structure has been formed;
- forming a light emitting functional layer on the display area through an ink jet printing process;
- forming a passivation layer on the light emitting functional layer;
- forming an encapsulation adhesive layer on the encapsulation area; and
- forming an encapsulation layer on the encapsulation adhesive layer.

18. The method for preparing the display substrate according to claim 16, wherein forming the hydrophobic structure on the encapsulation area comprises:
- forming a pixel defining layer on the base substrate, the pixel defining layer comprising a third barricade structure located in the encapsulation area; and
- dry etching the third barricade structure to roughen a surface of the third barricade structure to form the hydrophobic structure.

\* \* \* \* \*